United States Patent [19]

Heising

[11] Patent Number: 5,333,313
[45] Date of Patent: Jul. 26, 1994

[54] METHOD AND APPARATUS FOR COMPRESSING A DICTIONARY DATABASE BY PARTITIONING A MASTER DICTIONARY DATABASE INTO A PLURALITY OF FUNCTIONAL PARTS AND APPLYING AN OPTIMUM COMPRESSION TECHNIQUE TO EACH PART

[75] Inventor: Mark Heising, Palo Alto, Calif.

[73] Assignee: Franklin Electronic Publishers, Incorporated, Mt. Holly, N.J.

[21] Appl. No.: 601,268

[22] Filed: Oct. 22, 1990

[51] Int. Cl.⁵ .............................................. G06F 15/40
[52] U.S. Cl. .............................. 395/600; 364/419.11; 364/419.19; 364/DIG. 2; 364/750
[58] Field of Search ................. 364/DIG. 1, DIG. 2, 364/419; 395/600; 341/51

[56] References Cited

U.S. PATENT DOCUMENTS

| | | | |
|---|---|---|---|
| 4,122,440 | 10/1978 | Langdon, Jr. et al. | 341/51 |
| 4,168,513 | 9/1979 | Hains et al. | 358/261.2 |
| 4,594,686 | 6/1986 | Yoshida | 364/419 |
| 4,747,053 | 5/1988 | Yoshimura et al. | 364/419 |
| 4,782,325 | 11/1988 | Jeppsson et al. | 341/55 |
| 4,782,464 | 11/1988 | Gray et al. | 364/419 |
| 4,843,389 | 6/1989 | Lisle et al. | 341/106 |
| 4,959,785 | 9/1990 | Yamamoto et al. | 364/419 |

*Primary Examiner*—Paul V. Kulik
*Assistant Examiner*—John C. Loomis
*Attorney, Agent, or Firm*—McAulay Fisher Nissen Goldberg & Kiel

[57] ABSTRACT

A method and apparatus for compressing dictionary database information is described. The method divides the database information into a number of parts which are each conducive to a predetermined compression technique. A first part database is formed consisting of all the entry points in the dictionary wherein each entry point is associated with a unique word number. A second part database is formed consisting of a multiplicity of placeholders. A third part database is formed consisting of all the entry points of the dictionary in the exact order in which they appear in the dictionary. A fourth part database is formed consisting of the definitions and usage notes without reference to their text. A fifth part database allows retrieval of articles of interest without having to decompress the entire dictionary. Compression techniques using multigrams and minimum-redundancy codes are selectively applied to the different database parts.

12 Claims, 3 Drawing Sheets

METHOD AND APPARATUS FOR COMPRESSING A DICTIONARY DATABASE BY PARTITIONING A MASTER DICTIONARY DATABASE INTO A PLURALITY OF FUNCTIONAL PARTS AND APPLYING AN OPTIMUM COMPRESSION TECHNIQUE TO EACH PART

BACKGROUND OF THE PRESENT INVENTION

1. Field of the Present Invention

The present invention relates to compression techniques for dictionary databases.

2. Background of the Prior Art

While a great deal of work has been done in the area of text compression in general, relatively little work has been done on dictionary compression in particular. Many of the more general techniques used in text compression can be applied to dictionaries. Dictionaries, have certain properties, however, which allow methods of compression to be used which have no general use in text compression. Examples peculiar to dictionaries are that inflections are similar to their root words and entry words are stored alphabetically.

Reference is made to two references in the literature regarding compression:

[1] D. B. Conyes and J. M. Gilly, "Reversible Dictionary Compression by Reference to Redundant Components of Vocabulary", IBM Technical Disclosure Bulletin, pp. 4133-4135, January 1982; and

[2] James A. Storer, "Data Compression: Methods and Theory", Rockville, Md., Computer Science Press, 1988.

For a useful dictionary product, any compression technique must also address the problem of retrievability. It is not sufficient to simply compress the data as much as possible; the individual articles that make up a dictionary (an article being defined as the main entry, its associated inflections, parts of speech, definitions and other related information) must also be readily accessible.

Previous dictionary compression techniques take advantage of the redundancies found in dictionaries by forming rules. For example, a rule is applied where a plural is formed from the root word by adding an "s". The rule might also indicate that the part of speech for the root and its plural is a noun.

Several problems exist with this known method. Firstly, creating an exhaustive set of rules is tedious and is necessarily specific to the data. Given a new dictionary database, one may have to modify the rules. In addition, "unrules" must also be written to allow retrieval of the root. "Unrules" however, can give false entries. For example, an "unrule" might say that "apartments" inflect to the root word "apart", or that "digest" is the superlative form of "dig". These exceptions will adversely affect the compression.

Further, many words take on more than one part of speech. These parts of speech may take the form of separate articles called homographs. The complication that arises is that words may inflect to an invalid entry. For example, "recorded", the past tense of record, does not inflect to the noun "record". Accounting for all of these kinds of exceptions is a very difficult task.

A principal application for dictionary database compression is in portable electronic reference products. Such products typically store the database information on read-only-memory (ROM) chips. These chips represent a significant portion of the cost of electronic reference products. If the storage medium is hard-disk, the cost of data storage may be significant.

A known arrangement for electronic compression is set forth in FIG. 2. That arrangement 10 includes a microprocessor 11, a read only memory (ROM) 12, a random access memory 13, a display 16, a display controller 17, a keyboard 14 and a keyboard controller 15. The ROM 12 has stored therein the dictionary database and microprocessor instructions. The RAM 13 functions as a scratch pad. Control, data and address buses 18, 19 and 20 interconnect the various portions. The data bus is used to transfer data. The address bus is used to by the microprocessor to select a particular byte of data. The control bus is used by the microprocessor to select a particular device so that the device can share the same address and data bus. This figure is intended to represent one form of apparatus which may be used with the present invention and is not intended to restrict application of the invention in any way.

OBJECTS OF THE PRESENT INVENTION

A primary object of the present invention is to provide a technique for compression of dictionary database information.

A further object of the present invention is to provide a technique for compression of dictionary database information which avoids the use of complex rules and which, in its application, avoids the storage of the exceptions to such rules.

It is another object of the present invention to provide means for rapidly returning articles of the compressed dictionary database given an entry point of the master dictionary database.

It is a still further object of the present invention to provide a technique for compression of dictionary database information resulting in the use of fewer and/or smaller capacity read-only-memory chips in portable electronic reference products, and, consequently, a less costly product.

In accordance with the invention, a method for the compression of dictionary database information comprises the steps of forming a first part database from a master dictionary database consisting of all the entry points in the dictionary wherein each of these entry points is associated with a unique word number, forming a second part database from the master database consisting of a multiplicity of placeholders, each placeholder corresponding to one of the following: an entry, an inflection, a definition, a pronunciation, a part of speech, a usage note or the like, forming a third part database from the master database consisting of all the entry points of the dictionary in the exact order in which they appear in the dictionary and forming a fourth part database from the master database consisting of the definitions and usage notes without reference to their context. The method also includes the step of applying a predetermined compression technique to each said first part, second part, third part and fourth part database which is particularly appropriate to each said database part for providing a high degree of compression to said database information.

For a better understanding of the present invention, reference is made to the following description and accompanying drawings while the scope of the invention will be pointed out in the appended claims.

DESCRIPTION OF THE PREFERRED EMBODIMENTS

Figure 1A:
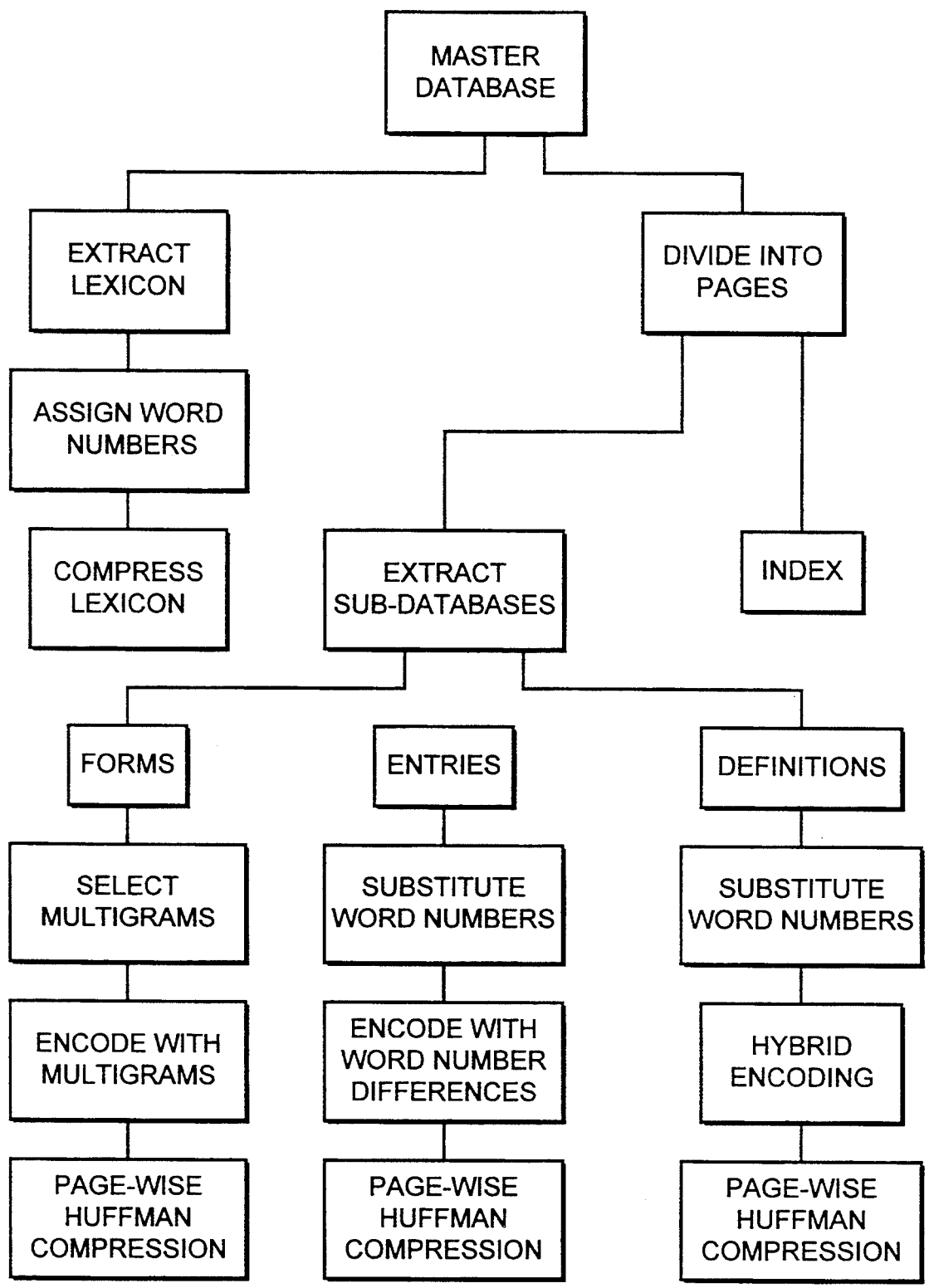
FIG. 1a represents a flow chart diagraming the principal steps of compressing a dictionary database.
Figure 1B:
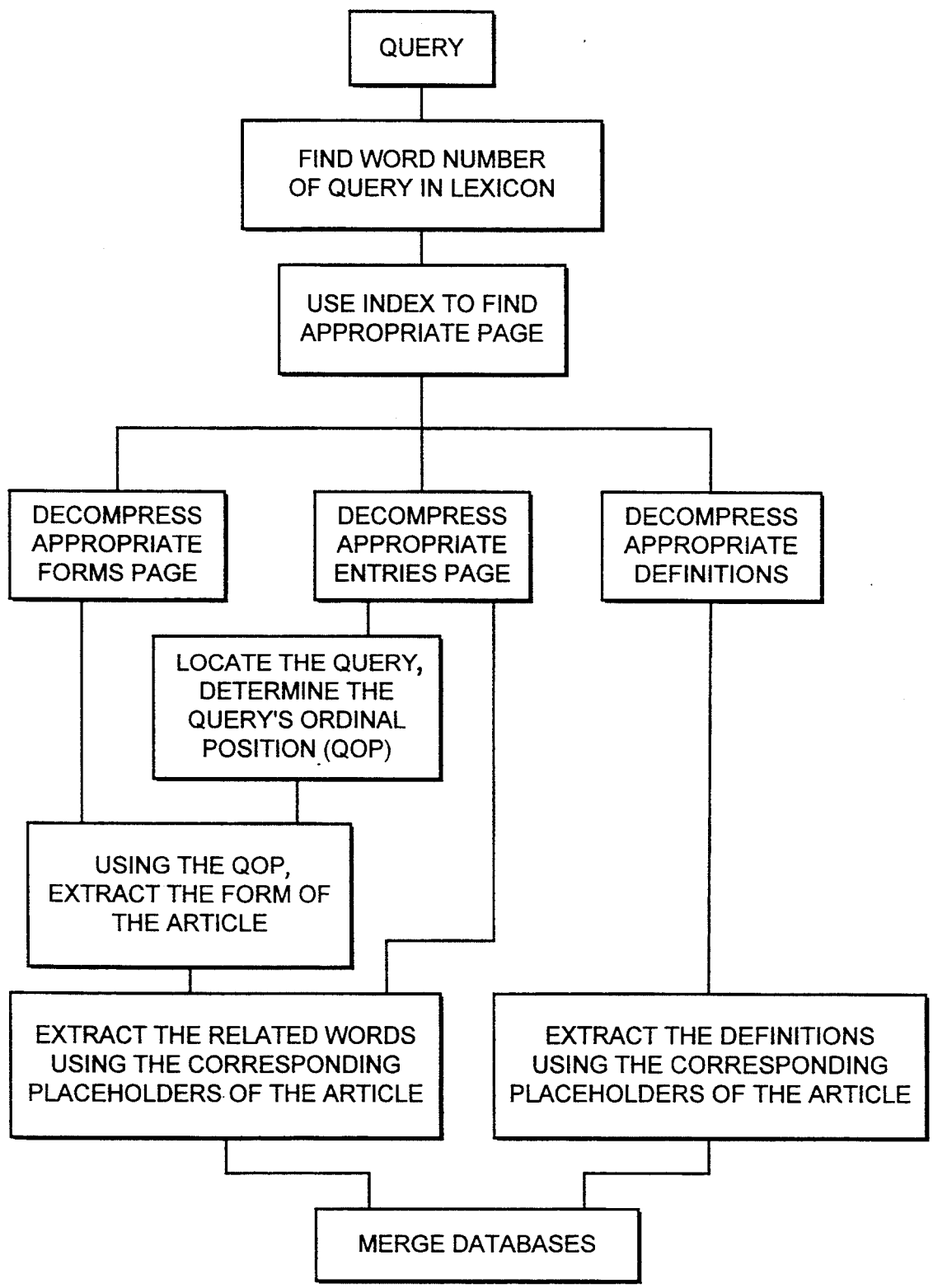
FIG. 1b represents a flow chart diagramming the principal steps of retrieving an article from a dictionary database which has been compressed according to the methods of the present invention.
Figure 2:
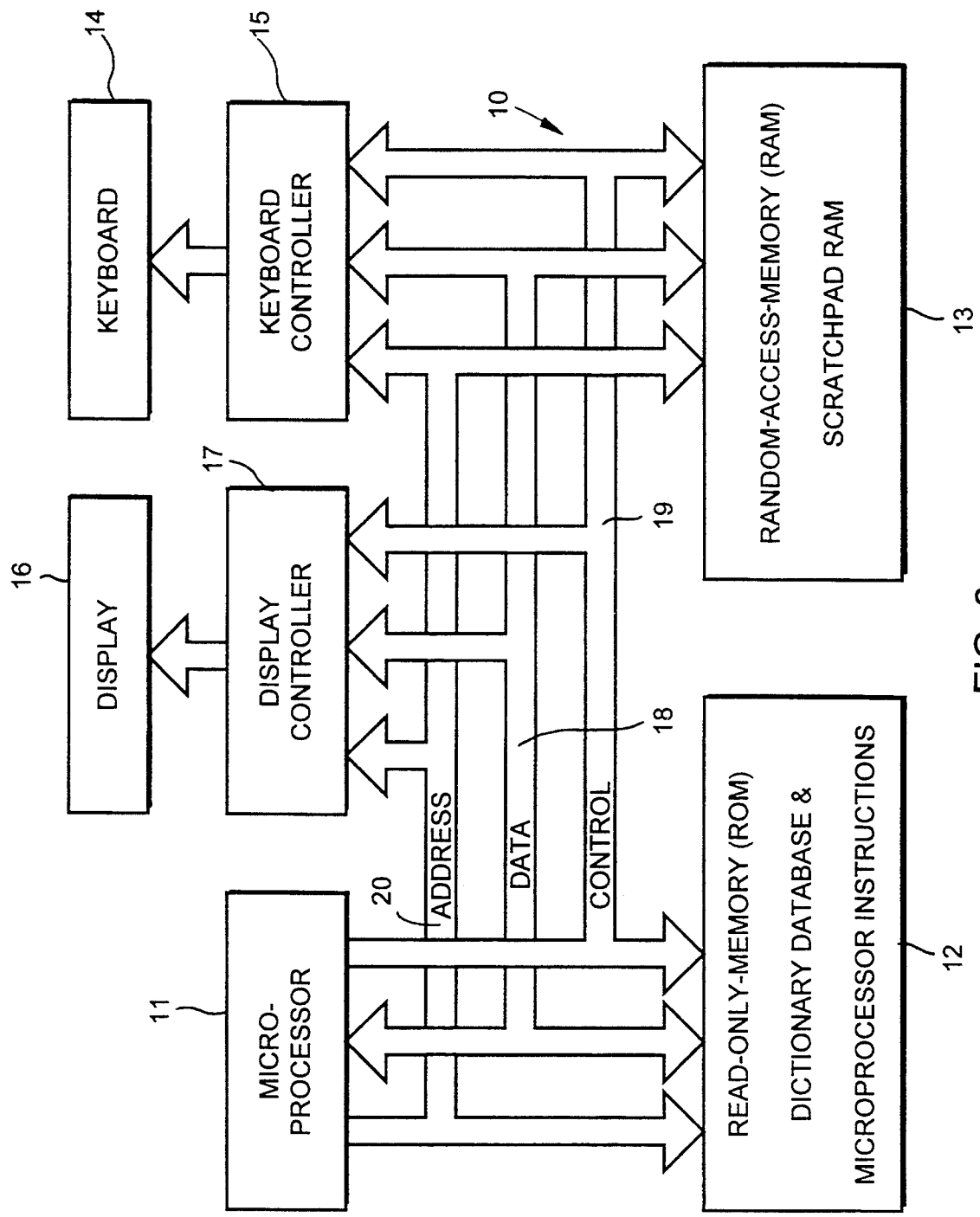
FIG. 2 represents, in block diagram, form a known portable electronic system for providing dictionary information.

The basic function of a dictionary is the ability to retrieve the article (previously defined) which contains a queried entry word. In accordance with the technique of the present invention, this retrieval is based on an approach which first divides the dictionary data into four distinct components. The four components are derived from a master database of the dictionary which contains all the usual information of a dictionary, i.e., entry words in alphabetical order with definitions, parts of speech, pronunciation and usage notes, which are presented on pages.

The first part is a database consisting of all the entry points (words) in the dictionary wherein each of these entry points is associated with a unique number. This number will hereafter be referred to as the "word number". In the compression of this part, the dictionary context is completely lost. This database permits encoding the rest of the database as word numbers, rather than character strings. This first part database shall be referred to as the "Lexicon" database.

The second part contains the form of the dictionary. Placeholders are extracted for each entry, inflection, definition, pronunciation, part of speech, usage note, etc. A "placeholder" is defined as an identifier which corresponds uniquely to each of the items above. This provides a kind of skeleton of a dictionary. The second part will be referred to as the "Forms" database.

The third part consists of the entry points in the exact order in which they appear in the dictionary. Hyphenation information is also stored in this part. This allows association of a given entry point with a particular entry in the dictionary. This third part will be referred to as the "Entry" database.

The fourth part consists of the definitions and usage notes stripped of their context. This fourth part will be referred to as the "Definitions" database.

A fifth database must also be provided to allow rapid retrieval of the articles within the dictionary. This database is an index to the compressed dictionary. By this means, articles of interest can be found without having to decompress the entire dictionary. Without such part, accessing entries would be unacceptably slow. This fifth database will be referred to as the "Index" database.

The first four databases are to be compressed with methods which are particular to their nature. The overall result is a compression which is superior to a general method which treats the entire database in a uniform manner.

The master database of the dictionary is divided into hundreds of parts which are called pages. Because decompression cannot start at an arbitrary point in the database, a convenient break point is selected to begin with. In this manner, it can be guaranteed that an article is not broken across pages. Given a query word, the index database may be used to locate the page or pages on which the entry is located.

The step of compressing the Lexicon is a technique which is described in Knuth. The general term for the structure used is a trie (sic). (See Knuth, The Art of Computer Programming, Vol. 3, Addison-Wesley Publishing Company; Reading, Mass.; 1973).

The Forms database is extracted from the main database. Page breaks are kept in the same order as the main database. There tend to be many repeated sequences in this database. To take advantage of this, multigram codes are formed which substitute for the sequence. (A multigram is a code which represents a sequence of simpler codes; these simpler codes are referred to as unigrams. These codes will be discussed further below). A digram is a special case of multigram that represents exactly two unigrams. The method for selecting an optimal set of multigrams is explained in detail in a later section.

Once the database has been encoded with these multigrams, it is compressed further using Huffman codes. (see D. A. Huffman, "A Method for the Construction of Minimum-Redundancy Codes", Proceedings of the IRE 40, pages 1098–1101, 1952). While this paper will continue to refer to Huffman codes, it should be noted that they are but one type of Minimum-Redundancy codes. Shannon-Fano codes and arithmetic codes are other examples of this kind of code. The implementation as presented here relies on Huffman codes, but other Minimum-Redundancy codes could be employed in its place.

The Entry database is extracted from the main database. Again, page breaks are kept in the same order as the main database. Because dictionaries are kept in alphabetical order, and because the word numbers are substantially alphabetical, the word numbers of the entry points are more or less found to be in consecutive order. By storing the differences between consecutive word number entries, the original word number can easily be recovered which reduces the storage requirements. The resulting database is then Huffman compressed for further compression.

The Definitions database is extracted from the main database. Again, page breaks are kept in the same order as in the main database. The words in the definitions are replaced with the word number equivalents. The resulting database undergoes a modified Huffman compression. To reduce the translation table overhead associated with Huffman codes, infrequently used words can be represented by an escape code followed by a literal word number. This eliminates an entry in the translation table for seldom used words, and saves a good deal of space.

The Index database is extracted from the Entry database. The Index database relates the word numbers in the database to the page numbers on which those entries appear. As the word numbers closely follow the alphabetical order, and as dictionaries list entries alphabetically, the word numbers appearing on a page can generally be collected into ranges. A range of word numbers is defined as a sequence of word numbers which is completely specified by a beginning word number and a ending word number. Because most pages contain a single range of word numbers, this database can be stored very efficiently.

Retrieval of an article from the above database parts is performed as follows. A query is made for a particular word. The corresponding word number is determined from the Lexicon database. The page or pages where this entry occurs are determined from the Index database. The Entry database is scanned for the location of the query. The first entry in that database initializes a counter. Subsequent values are also accumulated in the counter. At each step, the value in the counter is compared to the word number of interest. A second counter keeps track of the number of comparisons made and provides an offset. All entries are uniquely identified by a page number and an offset. When a word number of interest is found, the page number and offset are stored in the scratchpad random-access memory (13 of FIG. 3).

The placeholder in the Forms database corresponding to the entry offset found above determines the article of interest. As all articles are delimited by main entries (i.e. all articles start with a main entry, and end when the next article starts.), all of the placeholders associated with the article are determined. These provide the offsets, in order, for the offsets of the related inflections, definitions, parts of speech, usage notes, etc. Thus the article is reassembled from its component parts.

As indicated above, the separation of the master dictionary database into individual database parts, each of which is particularly adapted to special forms of compression, represents an essential concept of the present invention. Two principal types of compression, which will be applied to these database parts, are multigramming and Huffman compressions. Both of these are powerful methods for reducing data storage requirements. That the overall results depend on a unified treatment of these two techniques will now be demonstrated. A "greedy" strategy is used to select optimal multigrams. Multigrams are built up from digrams. A digram is a code that substitutes for two adjacent unigrams. A multigram is a code that substitutes for two or more adjacent unigrams. Multigrams can be made by putting together some combination of digrams and unigrams.

Typically, one selects multigrams on the basis of how frequently they occur. However, if the re-encoded data is then Huffman compressed, a compression inferior to having done no multigramming may result. A simple example will illustrate the problem.

Suppose a database consists of a sequence of two characters, 'A' and 'B'. 'AAAAABABABABABBBBBB' Let P(A) represent the probability of finding 'A' in the database D. Then $P(A)=\frac{1}{2}$, and $P(B)=\frac{1}{2}$. Thus, one can Huffman compress the database using 0 for the character 'A', and 1 for the character 'B'. Thus each character may be encoded with 1 bit. Then D may be presented by a sequence of 18 bits.

Now the most common multigram is the sequence 'AB'. If we encode the database with the new code, call it 'C'. Then the string becomes 'AAAACCCCCBBBB'. Then $P(A)=4/13$, $P(B)=4/13$, $P(C)=5/13$. Thus, the Huffman codes are respectively 2 bits, 2 bits and 1 bit. Using these codes, it takes 23 bits to represent D. Therefore, an injudicious selection of multigrams may degrade the compression.

The process by which multigrams are selected works as follows. First, a table relating unigrams to the number of occurrences of each unigram is constructed. Tables such as this will be referred to as frequency tables.

Next we construct a frequency table for all digrams in the database by proceeding through the database in linear order. That each unigram belongs to two adjacent digrams is not a problem, because we will only select one for encoding. A list of candidate digrams is obtained by sorting the digrams in order of frequency, with the most frequent digrams coming first. The candidate digrams, taken one at a time, are examined in descending order of frequency. The frequency table for unigrams is modified to include the effect of the candidate digram. The modified frequency table may be used to generate Huffman codes for this encoding. The size of the re-encoding database is readily determined by accumulating, for all codes, the product of the frequency and the length of its respective Huffman code.

When the digram which produces the most compression has been found, it is used to re-encode the database. The whole process is then repeated to find the next best digram. Multigrams are formed when at least one of the candidate digram halves is itself a digram.

Because the formation of new digrams can alter the frequency distribution of old digrams, it is possible to create digrams that cause the old digram to hurt the compression. Thus, whenever a new digram is formed from an old digram, one must ensure that each of the old digrams still improves the compression. That is, one must compare the compression to that which would occur if the old digram was replaced with its constituent unigrams. If the latter is superior, the replacement is made.

EXAMPLE

The following is a sample page from the dictionary. (Actually a partial page.) The '%' signs represent hyphenation points.

fac%ti%tious—adjective
1: artificial
—fac%ti%tious%ly—adverb
—fac%ti%tious%ness—noun
fac%tor, fac%tors—noun
1: something that has an effect
2: gene
3: number used in multiplying fac%tored,
fac%tored, fac%tor%ing, fac%tors—verb
4: resolve into factors
5: include or admit as a factor—used with
"into"—fac%tor%able—adjective The form of a dictionary entry is basically as follows: entry word, followed by optional inflections, followed by a part of speech, followed one or more definitions. This sequence may then be repeated if the word has more than one part of speech. Run-on entries have the same syntax as the main entry, except they may or may not be defined. In the above example, 'factor' is the main entry, while factorable is a run-on entry.

The form of the above page is expressed as follows:
entry
part of speech (adjective)
definition
run-on
part of speech (adverb)
run-on
part of speech (noun)
entry
inflection
part of speech (noun)
definition
definition definition
inflection
inflection
inflection
inflection
part of speech (verb)
{definition
{definition
run-on
part of speech (adjective)

The entry points are as follows:
factitious
factitiously
factitiousness
factor
factors
factored
factored
factoring
factors
factorable Each entry point corresponds to either an entry, an inflection, or a run-on.

The definitions, in turn, are parsed into words. End of definition symbols are inserted to keep the definitions separate. The first definition would then look as follows:
artificial
end-of-definition
something
that
has
an
effect
end-of-definition
etc. (so on for the other definitions)

The Forms database has the property that there are many recurring patterns. For instance, all verbs have four inflected forms. Therefore the sequence of four inflections and a verb part of speech may be encoded in a single symbol called a multigram. In addition, because some of the constituent parts occur much more frequently than others, Huffman compression works very well on this database. The key issue here is how does one select a set of multigrams such that the Huffman compression is optimized. This matter has been discussed in detail above.

The Entry database has the property that, in general, the words are close to being in alphabetical order. Then the corresponding word numbers must also be close. First, encode the entry database using the word number equivalents.
26013
26014
26015
26016
26023
26018
26018
26020
26023
26017

But this is inefficient. Suppose instead that the first number is saved and then the differences.
26013
1
1
1
7
−5
0
2
3
−6

These are much smaller numbers, and can be stored as fewer bits than the word numbers. The whole number, in fact, only needs to be stored at the beginning of the page, while only differences need be stored for all the other entry points on that page.

The Definitions database would appear as follows:
something
that
has
an
effect
end-of-definition
3489
0
66555
72103
32934
2144
22750
0
etc.

The resulting database is then Huffman compressed with literal escapes used for infrequently occurring words.

Retrieval works as follows. A query is made for the word 'factoring'. From the Lexicon database, it is found that this corresponds to word number 26020. The page or pages where this entry occurs are decompressed. The entry database is scanned for the word number 26020. Starting with 26013, we accumulate subsequent differences until we find 26020 at the 8th entry on the page. This is, in fact, the only occurrence on the page.

Retrieval works as follows. A query is made for the word 'factoring'. From the Lexicon database, it is found that this corresponds to word number 26020. The page or pages where this entry occurs is decompressed. The Entry database is scanned for word number 26020. Starting with 26013, we accumulate subsequent differences until we find 26020 at the 8th entry on the page. This is the only occurrence on the page.

The Forms database is then searched to determine to which the desired word belongs. Because an entry must be a main entry, an inflection, or a run-on entry, the eighth entry belongs to the second article on the sample page. As the article must start with a main entry, the Forms database shows that this second article is comprised of placeholders eight through twenty-two. This, in turn, shows that the related entries are at offsets four through ten in the Entry database, as only placeholders which correspond to entries, run-ons, and inflections, have corresponding elements in the Entry databasee. In addition, the related definitions are then at offsets two through six in the Definitions database, as only definitions have corresponding elements in the Definitions database (in this example, Usage Notes would also be included here). The article of interest has now been decompressed and reassembled.

The main steps of compressing a master dictionary database are indicated on flow chart 1a). The main steps of retrieval (following compression) are illustrated on flow chart 1b.

While the foregoing description and drawings represent the preferred embodiments of the present invention, it will be obvious to those skilled in the art that various changes and modifications may be made therein without departing from the true spirit and scope of the present invention.

What is claimed is:

1. A computer implemented method for the compression of dictionary database information comprising the steps of:

forming a first part database from a master dictionary database consisting of all the entry points in the dictionary wherein each of these entry points is associated with a unique word number;

forming a second part database from said master database consisting of a multiplicity of placeholders, each placeholder corresponding to one of the following: an entry, an inflection, a definition, a pronunciation, a part of speech, and a usage note;

forming a third part database from said master database consisting of all the entry points of the dictionary in the exact order in which they appear in the dictionary;

forming a fourth part database from said master database consisting of the definitions and usage notes without reference to their context;

from a plurality of compression techniques, selecting and applying to each said first part, second part, third part and fourth part a compression technique, the compression technique selected for each said database part being determined by which technique provides an optimum degree of compression to the database information in said part; and storing said compressed database information.

2. The method of claim 1 also comprising a fifth part database from said third part database consisting of a dictionary index to facilitate the retrieval of articles of interest, without, after compression, having to decompress the entire dictionary wherein the data of said third part database is organized into ranges of word numbers.

3. The method of claim 1 or claim 2 wherein the master database is divided into a predetermined number of parts called "pages" separated by page breaks, said second, third and fourth database parts having page breaks which match those of the master database.

4. The method of claim 3 wherein said fifth part database is used to locate the page or pages on which the entry is located.

5. The method of claim 1 wherein said second part database is compressed using predetermined multigram codes.

6. The method of claim 1 wherein said third part database is compressed by, firstly, re-encoding the word numbers as word number differences and, secondly, performing a Minimum-Redundancy code compression.

7. The method of claim 1 including the step of replacing the definitions in said fourth part database with the unique word number equivalent and compressing the result using Minimum-Redundancy code compression.

8. A computer implemented method for the compression and decompression of dictionary database information the steps of:

forming a first part database from a master dictionary database consisting of all the entry points in the dictionary wherein each of these entry points is associated with a unique word number;

forming a second part database from said master database consisting of a multiplicity of placeholders, each placeholder corresponding to one of the following: an entry, an inflection, a definition, a pronunciation, a part of speech, a usage note or the like;

forming a third part database from said master database consisting of all the entry points of the dictionary in the exact order in which they appear in the dictionary;

forming a fourth part database from said master database consisting of the definitions and usage notes without reference to their context;

from a plurality of compression techniques, selecting and applying to each said first part, second part, third part and fourth part a compression technique, the compression technique selected for each said database part being determined by which technique provides an optimum degree of compression to the database information of said part; and storing said compressed data base information, and the further steps of:

decompressing the compressed information of each database part for a predetermined article of interest; and merging the decompressed data base parts for said article of interest.

9. The use of a dictionary database compressed by forming a first part database from a master dictionary database consisting of all the entry points in the dictionary wherein each of these entry points is associated with a unique word number;

forming a second part database from said master database consisting of a multiplicity of placeholders, each placeholder corresponding to one of the following: an entry, an inflection, a definition, a pronunciation, a part of speech, a usage note or the like;

forming a third part database from said master database consisting of all the entry points of the dictionary in the exact order in which they appear in the dictionary;

forming a fourth part database from said master database consisting of the definitions and usage notes without reference to their context; and from a plurality of compression techniques, selecting and applying to each said first part, second part, third part and fourth part a compression technique, the compression technique selected for each said database part being determined by which technique provides an optimum degree of compression to the database information of that part;

storing said compressed information; and comprising a fifth part database from said third part database consisting of a dictionary index to facilitate the retrieval of articles of interest, without, after compression, having to decompress the entire dictionary, wherein the data of said third part database is organized into ranges of word numbers and wherein the master database is divided into a predetermined number of parts called "pages" separated by page breaks, said second, third and fourth database parts having page breaks which match those of the master database; said use comprising the steps of:

making a query for a particular entry word;

determining the equivalent word number from the first part data base;

decompressing the page or pages where this entry occurs;

scanning the third part database for the location of the query;

initializing a counter by the first entry on a chosen page, said counter also accumulating subsequent values;

comparing the value of said counter at each successive step with the work number corresponding to the query;

monitoring the number of comparisons made by a second counter and providing an offset, each entry being uniquely identified by page number and offset; and utilizing the page number and offset in the second part database to find a placeholder for the article of interest and using the other placeholders in the article of interest to determine the offsets of the related entry words and definitions so that the entire article of interest corresponding to said entry work may be obtained.

10. A method for the compression of dictionary database information in a microprocessor controlled, electronic reference device having a master dictionary database stored in a read-only memory, comprising the steps of:

forming a first part database from a master dictionary database consisting of all the entry points in the dictionary wherein each of these entry points is associated with a unique word number;

forming a second part database from said master database consisting of a multiplicity of placeholders, each placeholder corresponding to one of the following: an entry, an inflection, a definition, a pronunciation, a part of speech, a usage note or the like;

forming a third part database from said master database consisting of all the entry points of the dictionary in the exact order in which they appear in the dictionary;

forming a fourth part database from said master database consisting of the definitions and usage notes without reference to their context;

from a plurality of compression techniques, selecting and applying to each said first part, second part, third part and fourth part a compression technique, the compression technique selected for each said database part being determined by which technique provides a high degree of compression to the database information in said part and;

storing said compressed information.

11. Apparatus for compression of dictionary database information comprising:

first means for forming a first part database from a master dictionary database consisting of all of the entry points in the dictionary wherein each of these entry points is associated with a unique word number;

second means for forming a second part database from said master database consisting of a multiplicity of placeholders, each placeholder corresponding to one of the following: an entry, an inflection, a definition, a pronunciation, a part of speech, a usage note or the like;

third means for forming a third part database from said master database notes consisting of all entry points of the dictionary in the exact order in which they appear in the dictionary;

fourth means for forming a fourth part database from said master database consisting of the definitions and usage notes without reference to their context; and means coupled to said first means, second means, third means and fourth means for from a plurality of compression techniques, selecting and applying to each said first part, second part, third part and fourth part a compression technique, the compression technique selected for each said database part being determined by which technique provides an optimum degree of compression to the database information in said part.

12. In electronic reference apparatus having a microprocessor; a read-only memory, a random-access memory, a keyboard and a display, an improvement for compression of dictionary database information, said read-only memory having a master dictionary database stored therein, the improvement comprising:

first means for forming a first part database from said master dictionary database consisting of all of the entry points in the dictionary wherein each of these entry points is associated with a unique word number;

second means for forming a second part database from said master database consisting of a multiplicity of placeholders, each placeholder corresponding to one of the following: an entry, an inflection, a definition, a pronunciation, a part of speech, a usage note or the like;

third means for forming a third part database from said master database notes consisting of all entry points of the dictionary in the exact order in which they appear in the dictionary;

fourth means for forming a fourth part database from said master database consisting of the definitions and usage notes without reference to their context; and means forming part of said microprocessor and coupled to said first means, second means, third means and fourth means for, from a plurality of compression techniques, selecting and applying a compression technique to each said first part, second part, third part and fourth part, the compression technique selected for each said database part being determined by which technique provides a high degree of compression to the database information of said part.

* * * * *